(12) United States Patent
Cheol

(10) Patent No.: US 7,544,543 B2
(45) Date of Patent: Jun. 9, 2009

(54) SEMICONDUCTOR DEVICE WITH CAPACITOR AND FUSE, AND METHOD FOR MANUFACTURING THE SAME

(75) Inventor: Roh Il Cheol, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 118 days.

(21) Appl. No.: 11/646,993

(22) Filed: Dec. 28, 2006

(65) Prior Publication Data

US 2008/0001248 A1    Jan. 3, 2008

(30) Foreign Application Priority Data

Jun. 29, 2006    (KR) .................... 10-2006-0059910

(51) Int. Cl.
*H01L 21/82* (2006.01)
(52) U.S. Cl. ................ 438/132; 257/529; 257/E23.149
(58) Field of Classification Search .................. 257/529
See application file for complete search history.

(56) References Cited

U.S. PATENT DOCUMENTS

| | | | | |
|---|---|---|---|---|
| 6,271,082 B1 * | 8/2001 | Hou et al. | ................... | 438/250 |
| 6,504,203 B2 * | 1/2003 | Gambino et al. | ............ | 257/303 |
| 6,617,664 B2 * | 9/2003 | Hayashi et al. | ............. | 257/529 |
| 2003/0003721 A1 * | 1/2003 | Fortin | .......................... | 438/653 |
| 2003/0060009 A1 | 3/2003 | Cheng et al. | ................. | 438/254 |
| 2005/0110070 A1 | 5/2005 | Omura | ....................... | 257/311 |

FOREIGN PATENT DOCUMENTS

| | | |
|---|---|---|
| JP | 2001-326242 | 11/2001 |
| KR | 10-2003-0001814 | 1/2003 |
| KR | 10-2003-0068828 | 8/2003 |
| KR | 10-2005-0095690 | 9/2005 |

* cited by examiner

*Primary Examiner*—Sue Purvis
*Assistant Examiner*—Benjamin P Sandvik
(74) *Attorney, Agent, or Firm*—Marshall, Gerstein & Borun LLP

(57) ABSTRACT

A semiconductor device with a capacitor and a fuse, and a method for manufacturing the same are described. The semiconductor device comprises a semiconductor substrate having a capacitor region and a fuse region defined therein, an insulating layer over the semiconductor substrate, a storage node hole formed in the insulating layer, a barrier metal in the storage node hole, a dielectric layer formed on the barrier metal and the insulating layer, a lower metal layer for a plate electrode filling the storage node hole such that it is flush with the dielectric layer, an upper metal layer for the plate electrode on the dielectric layer and lower metal layer for the plate electrode; and a fuse metal layer formed of the same material as that of the upper metal layer for the plate electrode on the dielectric layer in the fuse region.

8 Claims, 4 Drawing Sheets

SEMICONDUCTOR DEVICE WITH CAPACITOR AND FUSE, AND METHOD FOR MANUFACTURING THE SAME

CROSS-REFERENCE TO RELATED APPLICATION

The present application claims priority to Korean patent application No. 10-2006-0059910, filed on Jun. 29, 2006, which is incorporated by reference in its entirety.

BACKGROUND OF THE INVENTION

The present invention relates to a semiconductor device, and, more particularly, to a semiconductor device with a capacitor and a fuse, which can prevent oxidation of the fuse and generation of cracks around the fuse upon blowing of the fuse, and a method for manufacturing the same.

While manufacturing a semiconductor memory such as a dynamic random access memory (DRAM), chips having inoperable memory cells partially formed therein can be made. Such defective memory cells are "replaced" with previously produced redundancy cells (in the chip) via a repairing process so that the chip of the semiconductor memory can operate normally without being affected by the inoperable memory cells, thereby improving a yield of the chip.

During the repairing process, a program is carried out within inner circuits to select the defective memory cells and change addresses of the defective memory cells to addresses of the redundancy cells. Therefore, in practical use, a line of the redundancy cells is selected to substitute a line of the defective cell in response to an input of an address signal corresponding to the line of the defective memory cells. One approach for such a program is a blowing method by which the defective line is burnt cut by a laser beam. Here, the line cut by the laser beam is referred to as a "fuse," and a cut portion and a region surrounding the cut portion are referred to as a "fuse box."

Currently, the fuse is formed of a metallic material rather than a polysilicon material to increase an integration degree and speed of the semiconductor memory. Corresponding to this, the fuse is formed along with a capacitor by forming the fuse with metal for a capacitor plate electrode having a metal-insulator-metal (MIM) structure, thereby simplifying a semiconductor manufacturing process.

Meanwhile, in the case where the fuse is formed to comprise the metal layer for the plate electrode deposited on a dielectric layer of the capacitor, if a metal layer for the plate electrode has properties vulnerable to oxidation, defects can occur when blowing the fuses.

FIGS. 1A and 1B show defects generated when blowing the fuse of the semiconductor device which comprises a capacitor and the fuse.

Referring to FIG. 1A, when blowing a fuse 30 of a fuse box as indicated by reference numeral 32, a metal layer of the blown fuse is exposed to atmosphere, causing volatile components contained in the metal layer to be out-gassed to the atmosphere. Accordingly, oxygen ($O_2$) can be further easily infiltrated into a site where the volatile components are out-gassed, causing oxidation of the metal layer. The oxidation of the metal layer constituting the fuse 30 can generate various defects on an interlayer dielectric, causing a problem such as a fuse blowing.

As shown in FIG. 1B, when the metal layer constituting the fuse 30 is oxidized because of infiltration of oxygen ($O_2$), a crack 34 is created in the interlayer dielectric due to oxidation, and propagates to an adjacent fuse which was not involved in the blowing operation, thereby causing defective fuses upon a high acceleration stress test (HAST) process.

SUMMARY OF THE INVENTION

Embodiments of the present invention relate to a semiconductor device which comprises a capacitor and a fuse constructed and arranged to prevent oxidation of the fuse and generation of cracks around the fuse upon blowing of the fuse, and a method for manufacturing the same.

In one embodiment, A semiconductor device with a capacitor and a fuse, comprising: a semiconductor substrate having a capacitor region and a fuse region defined therein; a insulating layer over the semiconductor substrate; a storage node hole formed in the insulating layer; a barrier metal in the storage node hole; a dielectric layer formed on the barrier metal and the insulating layer; a lower metal layer for a plate electrode filling the storage node hole such that it is flush with the dielectric layer; an upper metal layer for the plate electrode on the dielectric layer and lower metal layer for the plate electrode; and a fuse metal layer formed of the same material as that of the upper metal layer for the plate electrode on the dielectric layer in the fuse region.

The lower metal layer for the plate electrode may comprise a titanium nitride layer deposited by chemical vapor deposition, and the upper metal layer for the plate electrode and the fuse metal layer may comprise a titanium nitride layer deposited by physical vapor deposition.

In another embodiment, a method for manufacturing a semiconductor device with a capacitor and a fuse comprises forming a insulating layer over a semiconductor substrate; forming a storage node hole in the insulating layer to define a capacitor region and a fuse region; forming barrier metal in the storage node hole; forming a dielectric layer on the barrier metal and the insulating layer; forming a lower metal layer for a plate electrode such that it is flush with the dielectric layer, wherein the lower metal layer filling the storage node hole; and forming a fuse metal layer on the dielectric layer in the fuse region while forming an upper metal layer for the plate electrode on the dielectric layer and lower metal layer for the plate electrode.

The lower metal layer for the plate electrode may be a titanium nitride layer deposited by chemical vapor deposition, and have a thickness of about 150 Å to about 300 Å.

The upper metal layer for the plate electrode and the fuse metal layer may be a titanium nitride layer deposited by physical vapor deposition, and have a thickness of about 150 Å to about 300 Å.

In another embodiment, a method for manufacturing a semiconductor device with a capacitor and a fuse comprises forming a insulating layer over a semiconductor substrate; forming a storage node hole in the insulating layer; forming a barrier metal layer and a dielectric layer on the storage node hole; forming a titanium nitride (CVD-TiN) layer on the storage node hole by chemical vapor deposition; removing the CVD-TiN layer from an upper surface of the dielectric layer; forming a titanium nitride (PVD-TiN) layer on the dielectric layer and the CVD-TiN layer by physical vapor deposition; forming a capping layer on the PVD-TiN layer; and patterning the CVD-TiN layer and the PVD-TiN layer to form a capacitor region having the dielectric layer, CVD-TiN layer, PVD-TiN layer and the capping layer sequentially stacked therein, and a fuse layer having the dielectric layer, PVD-TiN layer and the capping layer sequentially stacked therein.

The step of removing the CVD-TiN layer may be performed by an etch-back process.

The capping layer may comprise a doped polysilicon.

BRIEF DESCRIPTION OF THE DRAWINGS

The foregoing and other embodiments and features of the present invention will be more clearly understood from the following detailed description taken in conjunction with the accompanying drawings, in which.

DESCRIPTION OF THE SPECIFIC EMBODIMENTS

Embodiments of the present invention will be described in detail with reference to the accompanying drawings.

Figure 1A:
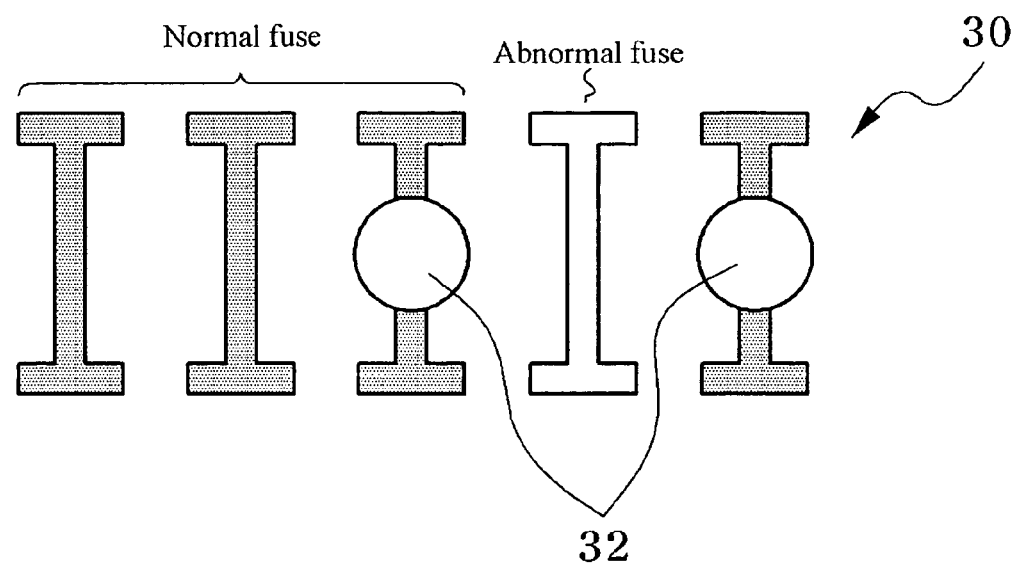
FIGS. 1A and 1B are views showing defects generated when blowing a fuse of a conventional semiconductor device.
Figure 1B:
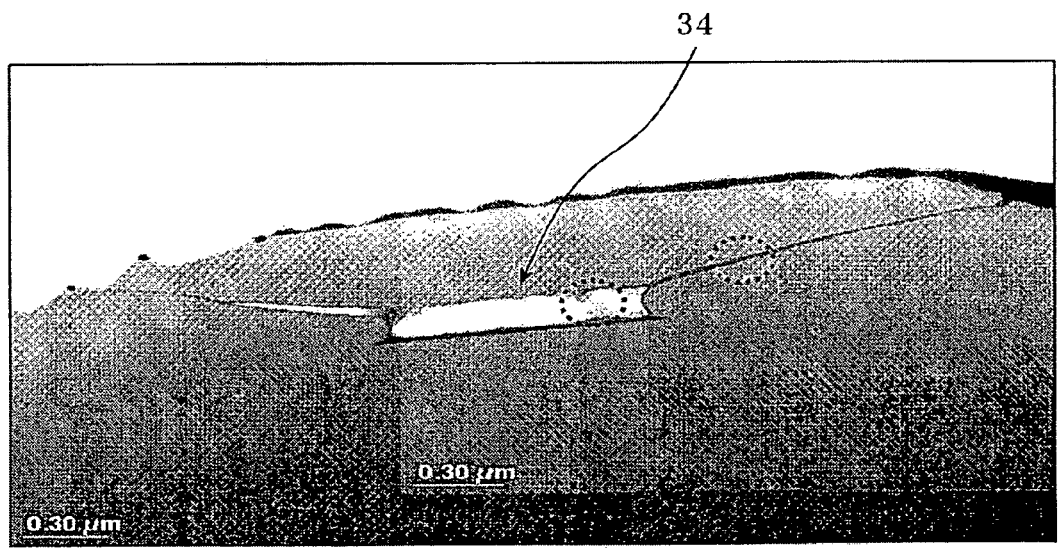
Figure 2:
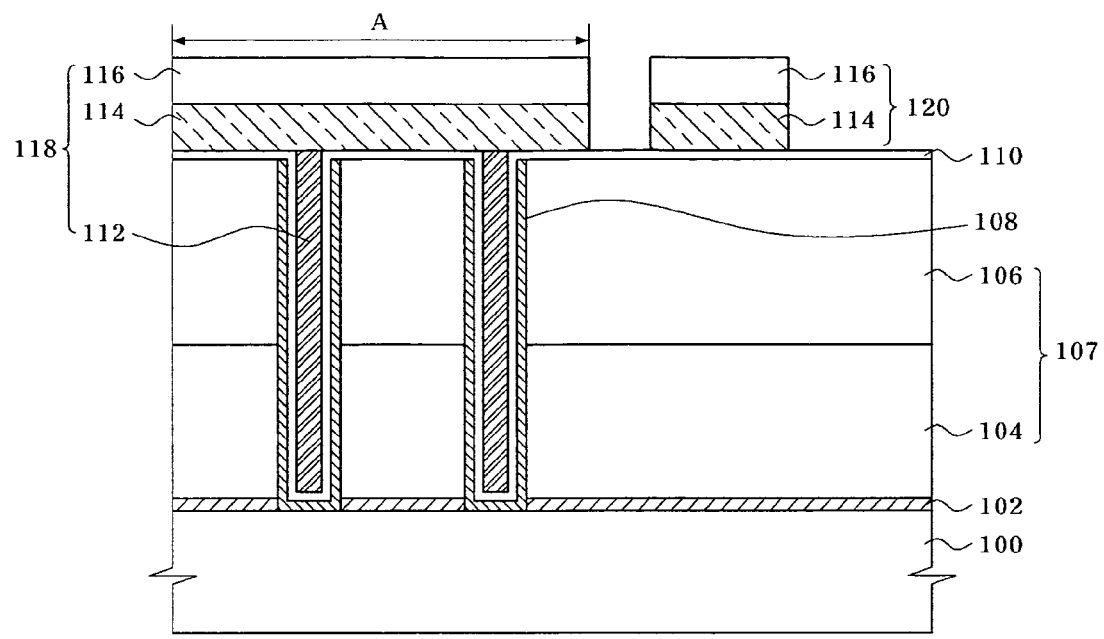
FIG. 2 is a cross-sectional view showing the structure of a semiconductor device comprising a capacitor and a fuse according to the present invention.

Referring to FIG. 2, the semiconductor device with the capacitor and the fuse according to the present invention comprises a semiconductor substrate 100 having a capacitor region A and a fuse region defined therein, and a thin etching stop layer 102 of silicon nitride (SiN) for a storage node electrode deposited on the semiconductor substrate 100. Here, although the semiconductor substrate 100 is formed with semiconductor diodes such as cell transistors, lines, etc. connected to capacitors, these components are not shown in the drawings for clear illustration.

A thick insulating layer 107 is deposited on the etching stop layer 102. The insulating layer 107 may be formed as a double layer which as illustrated has a phosphorus silicate glass (PSG) layer 104 and a tetra ethyl ortho silicate (TEOS) oxide layer 106 stacked therein.

A barrier metal layer 108, for example, a titanium/titanium nitride (Ti/TiN) layer, is formed on a bottom and a wall in an opening penetrating the insulating layer 107 and the etching stop layer 102.

A thin dielectric layer 110, for example, a tantalum oxide ($Ta_2O_3$) layer, is formed on the barrier metal layer 108 and the insulating layer 107.

As for a plate electrode 118, first and second titanium nitride layers 112 and 114, and a doped polysilicon layer 116 are stacked on the dielectric layer 110 in the capacitor region A. Here, the first titanium nitride layer 112, a lower metal layer of the plate electrode 118, fills the opening such that it is flush with the dielectric layer 110. More specifically, in the plate electrode 118, the titanium nitride (CVD-TiN) layer 112 is formed as the lower metal layer of the plate electrode 118 to fill the opening such that it is flush with the dielectric layer 110 by chemical vapor deposition (CVD). In addition, the titanium nitride (PVD-TiN) layer 114 is formed as an upper layer of the plate electrode 118 on the dielectric layer 110 and the titanium nitride (CVD-TiN) layer 112 by physical vapor deposition (PVD). The doped polysilicon layer 116 acting as a capping layer is stacked on the PVD-TiN layer 114 which is the upper layer of the plate electrode 118.

A fuse 120 is formed on an upper surface of the dielectric layer 110 in the fuse region. The fuse 120 is formed of the same material as that of the PVD-TiN layer 114, that is, the upper metal layer of the plate electrode 118, and has the doped polysilicon layer 116 acting as the capping layer stacked on the PVD-TiN layer 114.

Thus, for the semiconductor device having the fuse and the capacitor according to the invention, the CVD-TiN layer 114; that is, the lower metal layer of the plate electrode 118 of a capacitor, remains up to an upper surface of the opening in the insulating layer 107. In addition, as for a metal layer of the fuse 120, the PVD-TiN layer 114 having a high density is employed instead of the CVD-TiN layer 114 having a low density.

Accordingly, the semiconductor device of the invention can minimize oxidation of the fuse, which is formed of the same PVD-TiN material as that of the upper layer of the plate electrode 118, and generation of cracks around the fuse when blowing the fuse.

Since CVD-TiN has a relatively loose atomic structure due to characteristics of CVD when constituting the layer, it has a lower layer density than that of PVD-TiN. In addition, since CVD employs a precursor containing an organic or chlorine component as a source gas, impurities of the precursor remain at a relatively great amount in the layer. In particular, impurities of chlorine and the like remain in grain boundaries. Meanwhile, if CVD-TiN is exposed to atmosphere due to the existence of such impurities, CVD-TiN can be easily oxidized via reaction with moisture or oxygen gas in the atmosphere.

The chlorine component is out-gassed from the CVD-TiN layer to the atmosphere so that the oxygen gas can more easily infiltrate into a site of the CVD-TiN layer where chlorine component is out-gassed. As a result, oxidation of the CVD-TiN layer can more easily occur. Thus, if the metal layer of the fuse comprises CVD-TiN, the semiconductor device suffers from defects including oxidation of the overall fuse caused by the oxidation of CVD-TiN, and generation of the cracks thereby.

On the other hand, PVD-TiN has nearly no impurities due to characteristics of PVD, and has a higher layer density than that of CVD-TiN. Thus, even when PVD-TiN is exposed to atmosphere due to blowing of the fuse, PVD-TiN can more effectively resist oxidation. According to the present invention, CVD-TiN is avoided from being contained in the fuse, thereby more effectively preventing undesired oxidation of the fuse and generation of the cracks thereby.

FIGS. 3A to 3E are flow diagrams showing steps of a method for manufacturing a semiconductor device comprising a capacitor and a fuse according to the present invention.

There will be described hereinafter the method for manufacturing the semiconductor device according to the present invention with reference to these drawings.

Figure 3A:
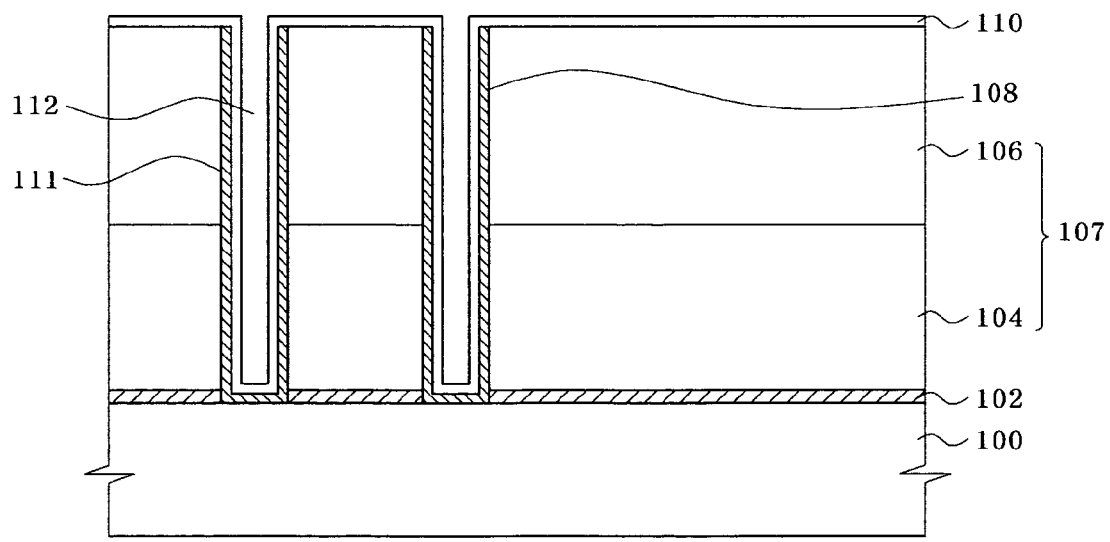
FIGS. 3A to 3E are flow diagrams showing steps of a method for manufacturing a semiconductor device comprising a capacitor and a fuse according to the present invention.

Referring to FIG. 3A, an etching stop film 102 for a storage node electrode is formed on the semiconductor substrate 100 having a capacitor region A and a fuse region defined therein. The etching stop layer 102 may be formed of a silicon nitride (SiN) layer. Here, although the semiconductor substrate 100 is formed with semiconductor diodes such as cell transistors, lines, etc. connected to capacitors, these components are not shown in the drawings for clear illustration.

Then, a thick insulating layer 107 is deposited on the etching stop layer 102. The insulating layer 107 may be formed as a double layer which has a phosphorus silicate glass (PSG) layer 104 and a tetra ethyl ortho silicate (TEOS) oxide layer 106 stacked therein.

Next, a photoresist is applied to an upper surface of the insulating layer 107. Then, a storage node hole 111 is formed to divide a storage node electrode by etching the insulating layer 107 and the etching stop layer 102 through an etching process using a mask. Then, a barrier metal layer 108, for example, a titanium/titanium nitride (Ti/TiN) layer, is formed over the insulating layer 107 having the storage node hole 111 formed therein. The barrier metal layer 108 is removed from the upper surface of the insulating layer 107 by a chemical mechanical polishing (CMP) process to allow the barrier metal layer to remain on a bottom and a wall in the storage node hole 111, that is, in an opening.

Next, a thin dielectric layer 110, for example, a tantalum oxide ($Ta_2O_3$) layer, is formed over the barrier metal layer 108 and insulating layer 107.

Figure 3B:
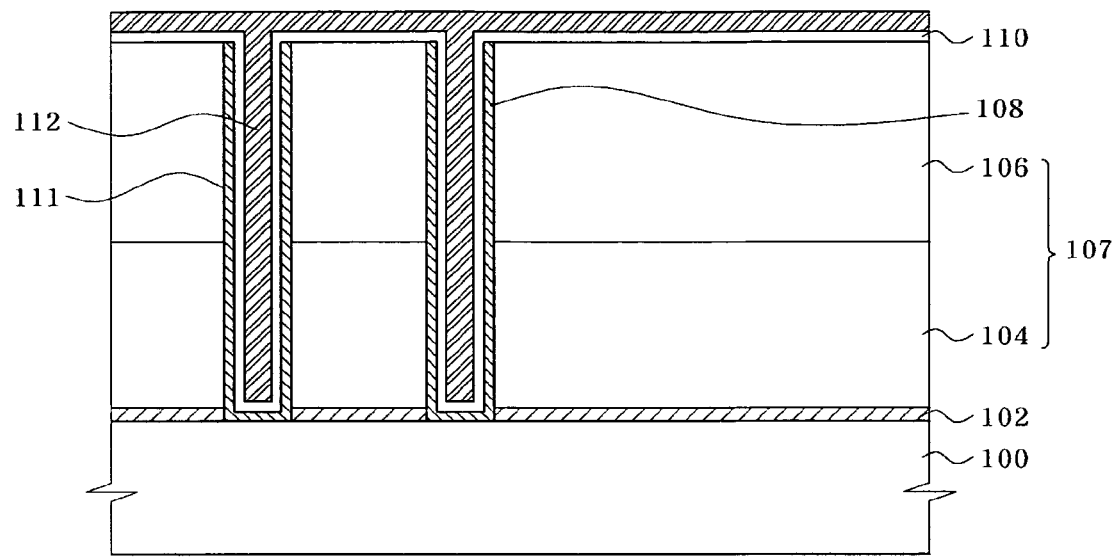

Referring to FIG. 3B, as a lower metal layer of a plate electrode, a titanium nitride (CVD-TiN) layer 112 is deposited to have a thickness of about 150 Å to about 300 Å on the dielectric layer by CVD.

Since the CVD-TiN layer 112 has a relatively loose atomic structure constituting the layer due to characteristics of CVD, it has a lower layer density than that of PVD-TiN. In addition, CVD employs a precursor containing an organic or chlorine component as a source gas. Thus, impurities of the precursor remain at a relatively great amount in the layer, in particular, in grain boundaries.

Meanwhile, if CVD-TiN is exposed to atmosphere due to existence of such impurities, CVD-TiN can be easily oxidized via reaction with moisture or oxygen gas in the atmosphere. Thus, if a metal layer of a fuse comprises CVD-TiN, the semiconductor device suffers from defects including oxidation of the overall fuse caused by the oxidation of CVD-TiN, and generation of cracks thereby.

In this regard, according to this embodiment it is attempted to prevent the cracks from being generated around the fuse by suppressing oxidation of the fuse metal layer.

Figure 3C:
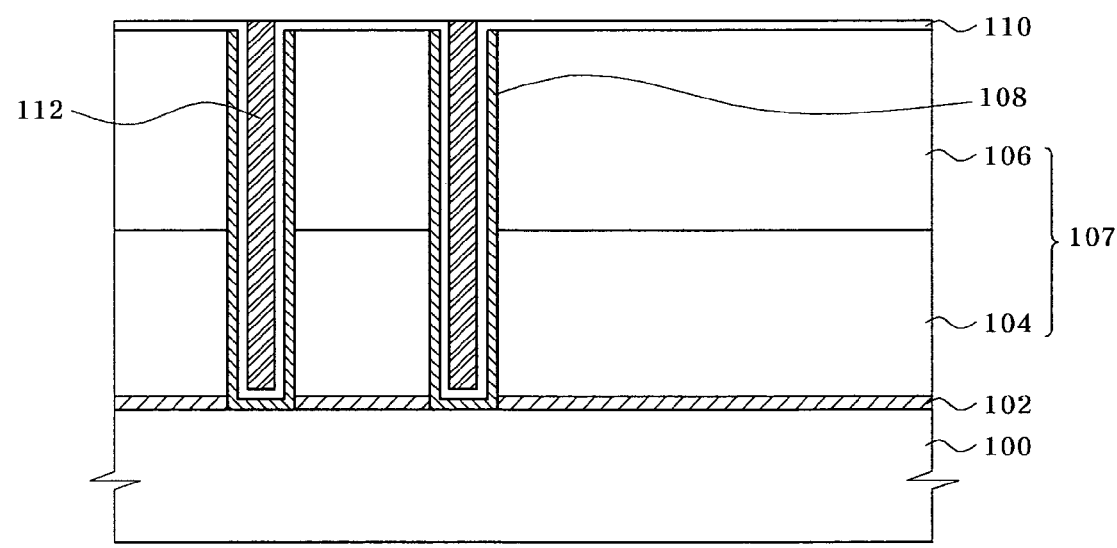

Referring to FIG. 3C, the CVD-TiN layer 112 is removed from an upper surface of the dielectric layer 110 by an etch-back process on the semiconductor substrate 100. Even though the CVD-TiN layer 112 is removed from an upper surface of the dielectric layer 110, the CVD-TiN layer 112 remains on a bottom and a wall of the opening of the capacitor region. Thus, the CVD-TiN layer 112 is completely removed from the fuse region, exposing the dielectric layer 110. In other words, the CVD-TiN layer 112 is removed from the upper surface of the dielectric layer 110 of the metal layer constituting the fuse, thereby making it possible to prevent oxidation of CVD-TiN and generation of the cracks.

Figure 3D:
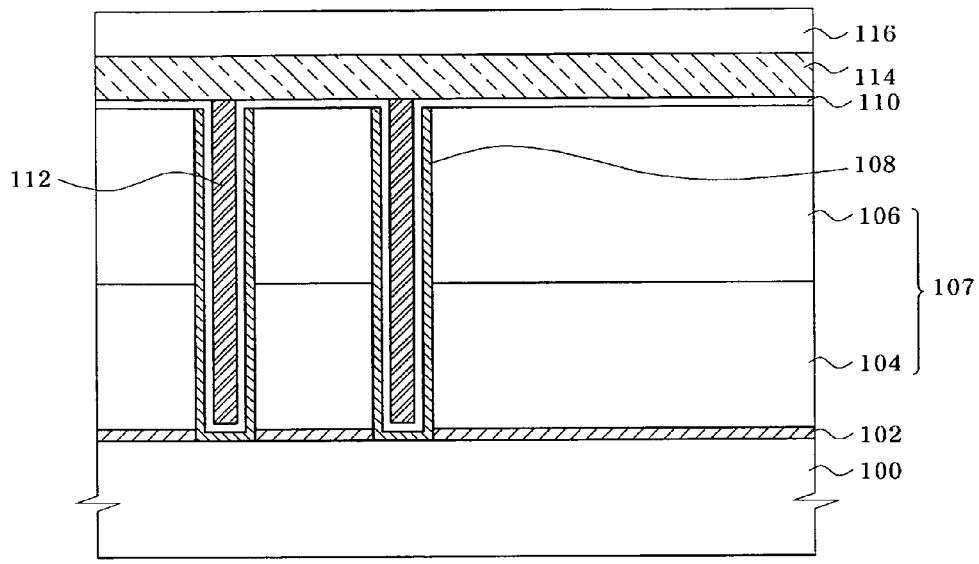

Referring to FIG. 3D, as an upper metal layer of the plate electrode and the fuse metal layer, a titanium nitride (PVD-TiN) layer 114 is formed to have a thickness of about 200 Å to about 800 Å on the resultant of the above steps by PVD. Then, a doped polysilicon layer 116 is deposited to have a thickness of about 300 Å to about 500 Å on the PVD-TiN layer 114 so as to act as a capping layer for the plate electrode and the fuse.

Then, the capacitor region has a double structure with the CVD-TiN layer 112 and the PVD-TiN layer 114 stacked therein, whereas the fuse region has only the PVD-TiN layer 114. As such, since the fuse region is formed with only the PVD-TiN layer 114, the PVD-TiN layer 114 of the fuse having a higher layer density prevents oxidation of the fuse caused by infiltration of oxygen ($O_2$) into the fuse during blowing of the fuse, and thus prevents the cracks from being generated around the fuse due to the oxidation of the fuse.

Figure 3E:
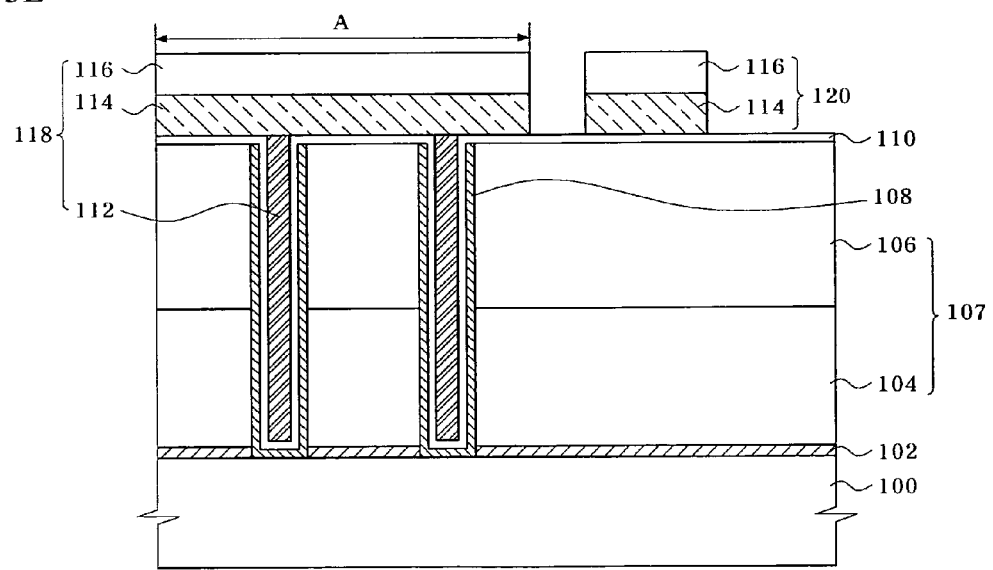

Referring to FIG. 3E, the doped-polysilicon 116 and the PVD-TiN layer 114 are patterned to form a plate electrode 118 and a fuse 120 in the capacitor region and the fuse region, respectively, by a photolithography process and an etching process using a capacitor and fuse mask.

With the method for manufacturing the semiconductor device with the capacitor and the fuse according to the present invention, the CVD-TiN layer 112 having an excellent gap-fill characteristic is allowed to remain as the lower metal layer for the plate electrode 118 of the capacitor in the opening penetrating the insulating layer 107 and the interlayer insulating layer (that is, PSG layer) 104. In addition, as for the upper metal layer of the plate electrode 118 and the metal layer of the fuse region at the same level, the PVD-TiN layer 114 having the higher layer density than that of the CVD-TiN layer is used.

As apparent from the above description, according to the present invention, a metal layer of a fuse is formed of a PVD-TiN layer having a higher layer density so that the metal layer of the fuse is prevented from being oxidized even under infiltration of oxygen ($O_2$) into the fuse during blowing of the fuse, and cracks caused by the oxidation of the fuse are thus prevented from being generated around the fuse, thereby reducing frequency of defective fuses during a HAST process.

It should be understood that the embodiments and the accompanying drawings have been described for illustrative purposes and that the present invention is limited only by the following claims. Further, those skilled in the art will appreciate that various modifications, additions and substitutions of the description provided herein are within the scope and spirit of the accompanying claims.

What is claimed is:

1. A method for manufacturing a semiconductor device with a capacitor and a fuse, comprising:
    forming an insulating layer over a semiconductor substrate;
    forming a storage node hole in the insulating layer to define a capacitor region and a fuse region;
    forming a barrier metal layer in the storage node hole;
    forming a dielectric layer on the barrier metal and the insulating layer;
    forming a lower metal layer for a plate electrode on the dielectric layer so as to fill the storage node hole;
    removing a portion of the lower metal layer disposed on an upper surface of the dielectric layer, wherein a remaining portion of the lower metal layer fills the storage node hole;
    forming an upper metal layer on the remaining portion of the lower metal layer and the dielectric layer; and
    patterning the upper metal layer to form a capacitor region having the dielectric layer, the remaining portion of the lower metal layer, and the upper metal layer sequentially stacked therein, and a fuse layer having a sequentially stacked structure of the dielectric layer and the upper metal layer sequentially stacked therein.

2. The method according to claim 1, wherein the lower metal layer for the plate electrode is a titanium nitride layer deposited by chemical vapor deposition.

3. The method according to claim 1, wherein the lower metal layer for the plate electrode has a thickness of about 150 Å to about 300 Å.

4. The method according to claim 1, wherein the upper metal layer for the plate electrode and the fuse metal layer are titanium nitride layers deposited by physical vapor deposition.

5. The method according to claim 1, wherein the upper metal layer for the plate electrode and the fuse metal layer have a thickness of about 150 Å to about 300 Å.

6. A method for manufacturing a semiconductor device with a capacitor and a fuse, comprising:
    forming a insulating layer over a semiconductor substrate;
    forming a storage node hole in the insulating layer;
    forming a barrier metal layer and a dielectric layer on the storage node hole;
    forming a titanium nitride (CVD-TiN) layer on the storage node hole by chemical vapor deposition;
    removing the CVD-TiN layer from an upper surface of the dielectric layer;

forming a titanium nitride (PVD-TiN) layer on the dielectric layer and the CVD-TiN layer by physical vapor deposition;

forming a capping layer on the PVD-TiN layer; and patterning the CVD-TiN layer and the PVD-TiN layer to form a capacitor region having the dielectric layer, CVD-TiN layer, PVD-TiN layer and the capping layer sequentially stacked therein, and a fuse layer having the dielectric layer, PVD-TiN layer and the capping layer sequentially stacked therein.

7. The method according to claim 6, wherein the step of removing the CVD-TiN layer is performed by an etch-back process.

8. The method according to claim 6, wherein the capping layer comprises a doped polysilicon.

* * * * *